(12) United States Patent
Yoshida et al.

(10) Patent No.: US 6,340,797 B1
(45) Date of Patent: Jan. 22, 2002

(54) PRINTED CIRCUIT BOARD HAVING SIGNAL PATTERNS OF VARYING WIDTHS

(75) Inventors: Takashi Yoshida; Masahide Watanabe; Nobuo Taketomi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/468,295

(22) Filed: Dec. 21, 1999

(30) Foreign Application Priority Data

Apr. 30, 1999 (JP) ............................................ 11-125015

(51) Int. Cl.⁷ ................................................. H05K 1/16
(52) U.S. Cl. ........................................................ 174/260
(58) Field of Search ................................ 174/260, 261; 361/767, 768, 771, 772, 774, 777, 779, 780, 783

(56) References Cited

U.S. PATENT DOCUMENTS

| | | | |
|---|---|---|---|
| 4,973,799 A | * 11/1990 | Soma et al. | 174/260 |
| 5,471,368 A | * 11/1995 | Downie et al. | 361/760 |
| 5,541,369 A | * 7/1996 | Tahara et al. | 174/268 |
| 5,641,946 A | 6/1997 | Shim | 174/261 |
| 6,064,116 A | * 5/2000 | Akram | 257/723 |

FOREIGN PATENT DOCUMENTS

| | | |
|---|---|---|
| JP | 9-27568 | 1/1997 |
| JP | 9-107165 | 4/1997 |
| JP | 10-126029 | 5/1998 |

* cited by examiner

*Primary Examiner*—Brian Sircus
*Assistant Examiner*—Javaid Nasri
(74) *Attorney, Agent, or Firm*—Armstrong, Westerman, Hattori, McLeland & Naughton, LLP

(57) ABSTRACT

A printed circuit board is provided with a plurality of insulator layers and a plurality of conductor layers, and an outermost conductor layer has a plurality of foot patterns in outer and inner rows for mounting a BGA component and signal patterns. The width of at least a part of the signal pattern extending from the foot pattern in the outer row is greater than the width of the signal pattern extending from the foot pattern in the inner row. The printed circuit board further includes a protection layer for covering the signal patterns on the outermost conductor layer, and the protection layer has openings each for permitting the foot pattern to be exposed. At least a portion of the signal pattern appearing in the opening is widened.

8 Claims, 6 Drawing Sheets

PRINTED CIRCUIT BOARD HAVING SIGNAL PATTERNS OF VARYING WIDTHS

BACKGROUND OF THE INVENTION

1. Field of the Invention

The present invention relates to a printed circuit board, suitable for the attachment of an electric or electronic component (for instance, a BGA component), and a semiconductor apparatus including such a printed circuit board and such a component.

2. Description of the Related Art

Currently, various types of printed circuit boards are used. A multiple-layered printed circuit board comprises a plurality of insulator layers and a plurality of conductor layers (for instance, six to eight signal pattern layers). An outermost conductor layer has a plurality of foot patterns for attachment of an electric or electronic component and signal patterns extending from those foot patterns. The signal pattern that is pulled out from the foot pattern for a BGA component is pulled out for wiring such that the pattern has a certain uniform pattern width except for a power supply wire and a ground wire.

The BGA stands for Ball Grid Array and describes a chip having small spherical solder terminals arranged on the back thereof (in many cases arranged in a grid-like fashion). When this BGA chip (or a BGA component) is placed on a substrate and is heated by applying infrared thereto, the spherical solder terminals thereof are fused to join with terminals of the substrate. In other words, the BGA chip is surface mounted to the substrate. Since the BGA terminals can be disposed on the entirety of the back of the chip or component, the distance between the terminals of the chip or component can be formed relatively greater. In addition, with BGA, there is provided an advantage in which a package for the chip or component can be made compact even if the chip or component has a number of terminals.

The insulator layers are formed from a glass cloth material or a resin material, and the outermost conductor layer is protected with a solder resist. The solder resist covers signal patterns of the outermost conductor layer and has openings for permitting foot patterns to be exposed. A BGA component, which is an electric or electronic component to be mounted to a printed circuit board, has solder balls and these solder balls are connected to the foot patterns of the printed circuit board through the openings of the solder resist.

A printed circuit board which is highly durable and reliable has a plurality of insulator layers formed from a glass cloth material. Most insulator layers are formed from a glass cloth material, but an insulator layer positioned directly underneath a conductor layer including foot patterns is not formed from a glass cloth material but from a resin material, and a printed circuit board including such an insulator layer formed from a resin material is called and known as a built-up substrate. When compared with a printed circuit board in which all the insulator layers thereof are formed from a glass cloth material, the built-up substrate is lighter in weight and suitable for use in a semi-conductor apparatus such as a portable information apparatus or the like.

A number of electric or electronic components are mounted to a printed circuit board. In particular, a BGA component has solder bumps or solder balls, and is attached to the printed circuit board through the reflow of the solder thereof. The printed circuit board is subjected to stress due to thermal expansion at the time of reflow and mechanical stress (external stress) generated during an electrical test after the components are mounted or when the printed circuit board is built into an apparatus. It sometimes happens that stress is concentrated on a portion of the printed circuit board where the BGA component is positioned. The BGA component is relatively large in external size and is more rigid than the printed circuit board. In addition, a small foot pattern is used to join the BGA component to the printed circuit board.

When stress is applied to the printed circuit board, the printed circuit board deforms relative to the printed circuit board, or the BGA component deforms relative to the printed circuit board. When the printed circuit board and the BGA component deform relative to each other, stress tends to be easily applied to the foot patterns, in particular, the foot pattern in an external row and a signal pattern extending the foot pattern.

An insulator layer formed using no glass cloth material has a mechanical strength lower than that of an insulator layer formed using a glass cloth material, and therefore the former is liable to deform. When a certain stress is applied to a foot pattern and a signal pattern in an outer row, an insulator positioned underneath them is also subjected to the stress locally and liable to deform. Due to this, the signal pattern extending from the foot pattern in the outer row is liable to deform and therefore break. In addition, an insulator formed from a resin material tends to be easily damaged.

Moreover, the aforesaid problem happens even when another type of LSI packaged electronic component is used.

For instance, it happens even when a PGA (Pin Grid Array in which pin-type terminals are arranged on the back of a semi-conductor in a two-dimensional fashion) or the like is mounted on a printed circuit board. In addition, the problem happens in not only a multiple-layered printed circuit board but also a single-layered one. Moreover, the problem happens even when a pin-type terminal such as a PGA is inserted and mounted. Furthermore, assuming that a PGA terminal or the like (typically, a pin-like terminal) is surface mounted on a foot pattern, the problem may happen.

SUMMARY OF THE INVENTION

An object of the present invention is to provide a printed circuit board and a semiconductor apparatus which is constructed such that a signal pattern extending from a foot pattern is difficult to break even when a stress is applied to the printed circuit board and a component thereon.

With a view to attaining the above object, the present invention provides a printed circuit board having a plurality of connecting portions for connection to terminals of a component and signal patterns extending from the connecting portions, the connecting portions including outer connecting portions and inner connecting portions, wherein the width of at least a part of the signal pattern extending from the outer connecting portion is greater than the width of the signal pattern extending from the inner connecting portion.

The present invention also provides a printed circuit board having a plurality of foot patterns for attachment of a component and signal patterns extending from the foot patterns, the foot patterns including outer foot patterns and inner foot patterns, wherein the width of at least a part of the signal pattern extending from the outer foot pattern is greater than the width of the signal pattern extending from the inner foot pattern.

The present invention further provides a printed circuit board, wherein the width of the signal pattern extending from the outer foot pattern is constant along the length thereof.

The present invention also provides a printed circuit board, wherein the signal pattern extending from the outer foot pattern has a first portion a predetermined distance distant from a connection position between the foot pattern and the signal pattern and a second portion connected to the first portion, wherein the width of the first portion of the signal pattern is greater than the width of the second portion of the signal pattern.

The present invention further provides a printed circuit board further including a plurality of insulator layers and a plurality of conductor layers, wherein an outermost layer of the conductor layers includes the foot patterns for attachment of a component.

The present invention also provides a printed circuit board, wherein the insulator layers include a first insulator layer positioned directly underneath the outermost layer and a second insulator layer positioned inwardly of the first insulator layer, the first insulator layer being formed using a resin material, the second insulator layer being formed using a glass cloth material.

The present invention further provides a semiconductor apparatus comprising a printed circuit board, and a component mounted to the printed circuit board, wherein the printed circuit board has a plurality of foot patterns for attachment of a component and signal patterns extending from the foot patterns, wherein the foot patterns include outer foot patterns and inner foot patterns, and wherein the width of at least a part of the signal pattern extending from the outer foot pattern is greater than the width of the signal pattern extending from the inner foot pattern.

According to the above construction, the width of the signal pattern extending from the foot pattern in the outer row located at a position where a deformation is liable to happen when a stress is applied thereto is made greater than the width of the foot pattern in the inner row where a deformation is difficult to happen even when a stress is applied thereto, whereby the signal pattern located at the position where a deformation is liable to happen is constructed so as to be free from deformation.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
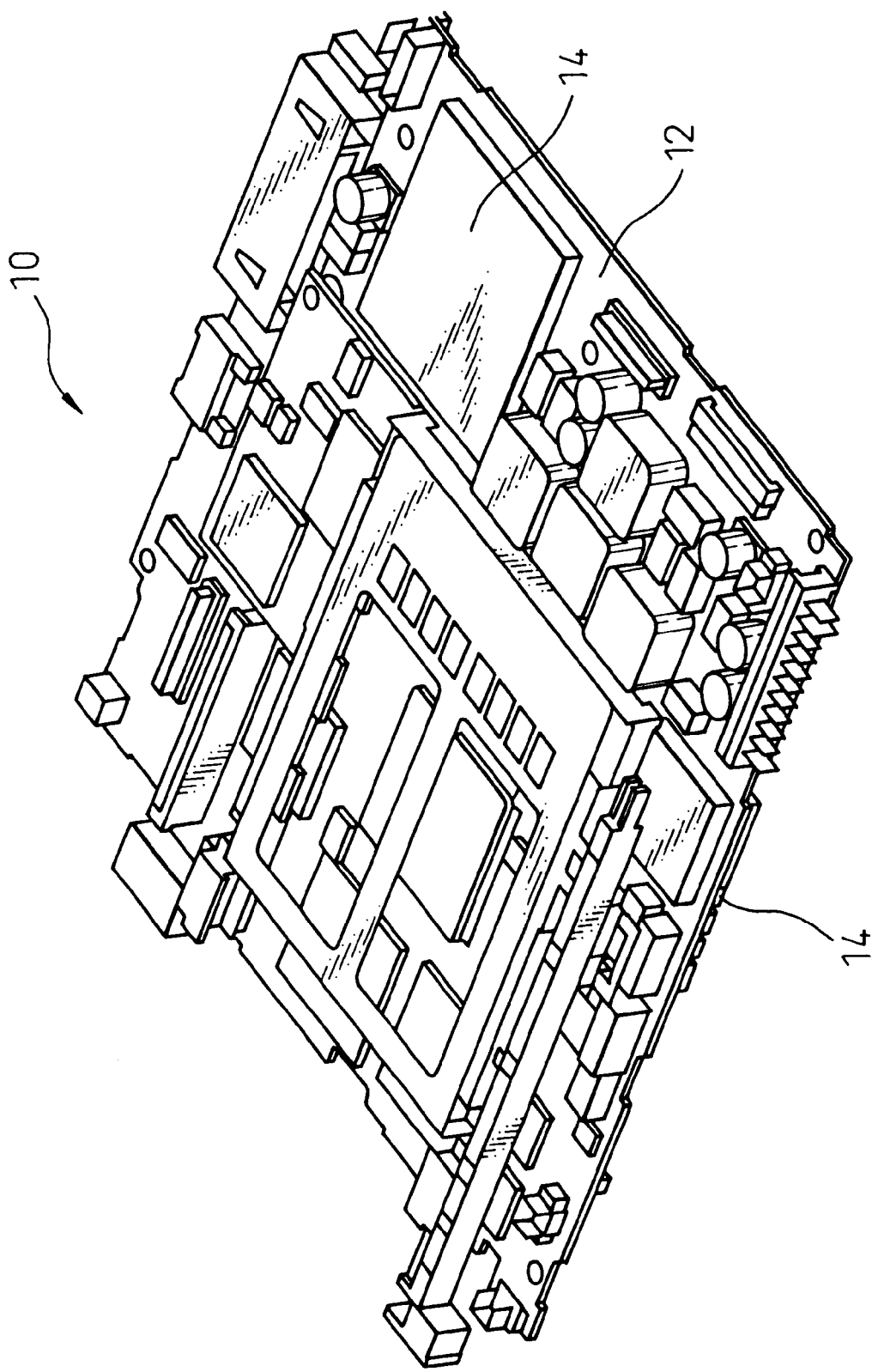
FIG. 1 is a perspective view showing an embodiment of a semiconductor apparatus according to the present invention.

Referring to the drawings, the preferred embodiment of the present invention will be described below.

As a typical example of the application of the present invention, a case will be described in which a BGA chip (or a BGA component) is surface mounted onto a printed circuit board.

FIG. 1 is a perspective view showing the embodiment of a semiconductor apparatus according to the present invention. The semiconductor apparatus 10 has a printed circuit board 12, to which number of electric/electronic components are mounted. A BGA component 14 is mounted to the one of the surfaces of the printed circuit board 12 and another BGA component 14 is mounted to the other surface of printed circuit board 12.

Figure 2:
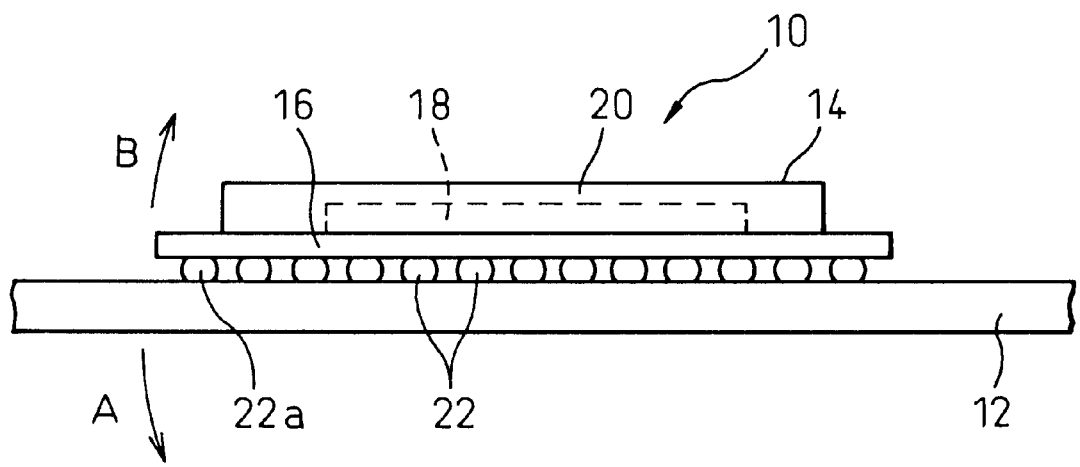
FIG. 2 is a side view showing a part of the printed circuit board to which a BGA component shown in FIG. 1 is mounted.

FIG. 2 is a partial side view showing a part of the printed circuit board 12 shown in FIG. 1 where the BGA component 14 is mounted. The BGA component 14 comprises a substrate 16 and a semiconductor element 18 mounted to the substrate 16, and the semiconductor element 18 is encapsulated with an encapsulation resin 20. The semiconductor element 18 is mounted to one side of the substrate 16 and solder balls 22 are provided on the other side of the substrate 16. The semiconductor element 18 is connected to electrode pads provided on the substrate 16, and the solder balls 22 are also connected to the electrode pads provided on the substrate 16. The semiconductor element 18 is thus electrically connected to the solder balls 22.

The solder balls 22 of the BGA function as electric terminals with respect to the printed circuit board 12.

Figure 3:
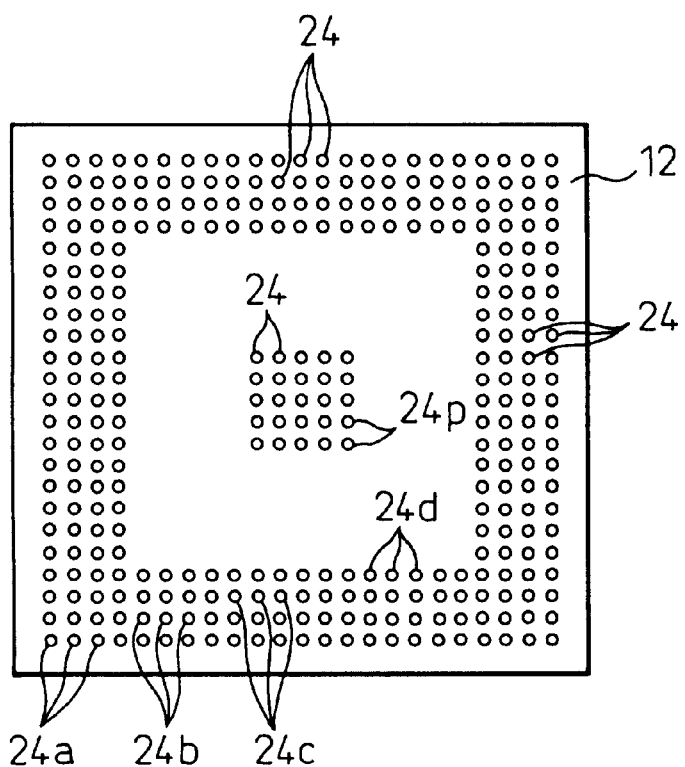
FIG. 3 is a plan view showing a part of the printed circuit board to which the BGA component is mounted.

FIG. 3 is a plan view showing a part of the printed circuit board 12 where the BGA component 14 is mounted. The printed circuit board 12 has a group of foot patterns 24 provided and arranged so as to correspond to the arrangement of the solder balls 22 of the BGA component that is to be mounted. The foot patterns 24 are provided in a grid-like arrangement, in which four rows of foot patterns 24a to 24d are provided in a quadrangularly annular fashion. To be more specific, the foot patterns 24 comprise an outer row of foot patterns 24a, a row of foot patterns 24b inwardly of the outer row, a row of foot patterns 24c further inwardly of the row of the foot patterns 24b, and a row of foot patterns 24d inwardly of the row of the foot patterns 24c. In addition, there are also foot patterns 24p provided at the central portion of an area where the BGA component 14 is mounted.

Figure 4:
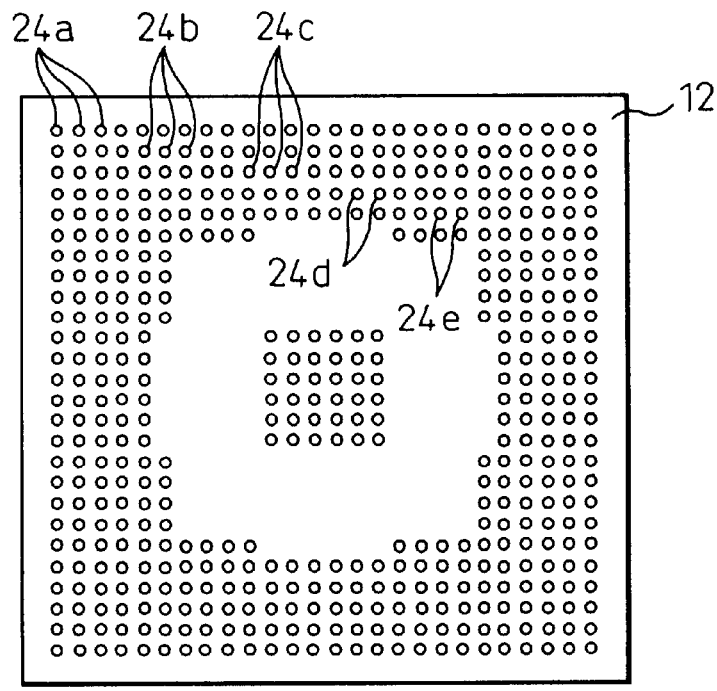
FIG. 4 is a plan view showing a modification of the foot pattern arrangement.

FIG. 4 is a plan view showing a modification of the arrangement of the foot patterns 24. In this modified example too, the foot patterns 24 include an outer row of foot patterns 24a, a row of foot patterns 24b inwardly of the outer row of the foot patterns 24a, a row of foot patterns 24c further inwardly of the row of the foot patterns 24b, a row of foot patterns 24d further inwardly of the row of the foot patterns 24c, a row of foot patterns 24e further inwardly of the row of the foot patterns 24d, and foot patterns at the central portion of a mounting area for the BGA component 14.

Figure 5:
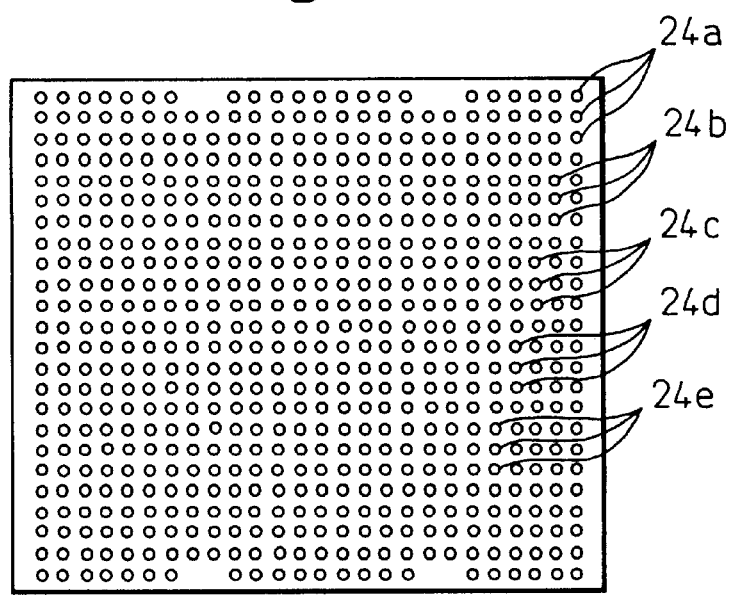
FIG. 5 is a plan view showing another modification of the foot pattern arrangement.

FIG. 5 is a plan view showing another modification of the arrangement of the foot patterns 24. In this modified example, the foot patterns 24 are provided over the entirety of the surface of an area where the BGA component 14 is mounted. The foot patterns 24 include an outer row of foot patterns 24a, a row of foot patterns 24b inwardly of the outer row of the foot patterns 24a, a row of foot patterns 24c further inwardly of the row of the foot patterns 24b, a row of foot patterns 24d further inwardly of the row of the foot patterns 24c, a row of foot patterns 24e further inwardly of the row of the foot patterns 24d, and rows of foot patterns further inwardly of the row of the foot patterns 24e and the like.

Figure 6:
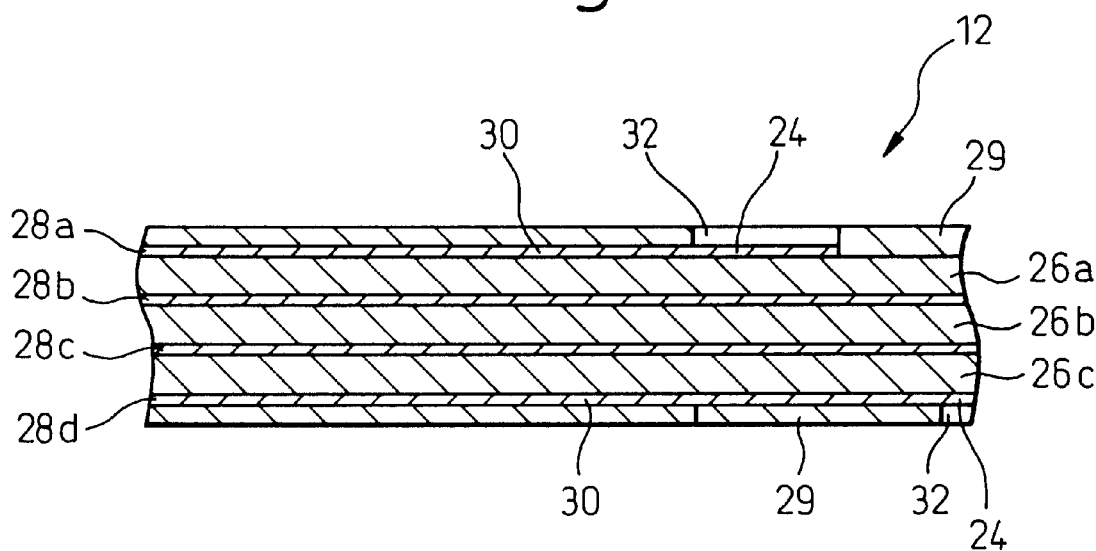
FIG. 6 is a cross-sectional view of the printed circuit board.
Figure 7:
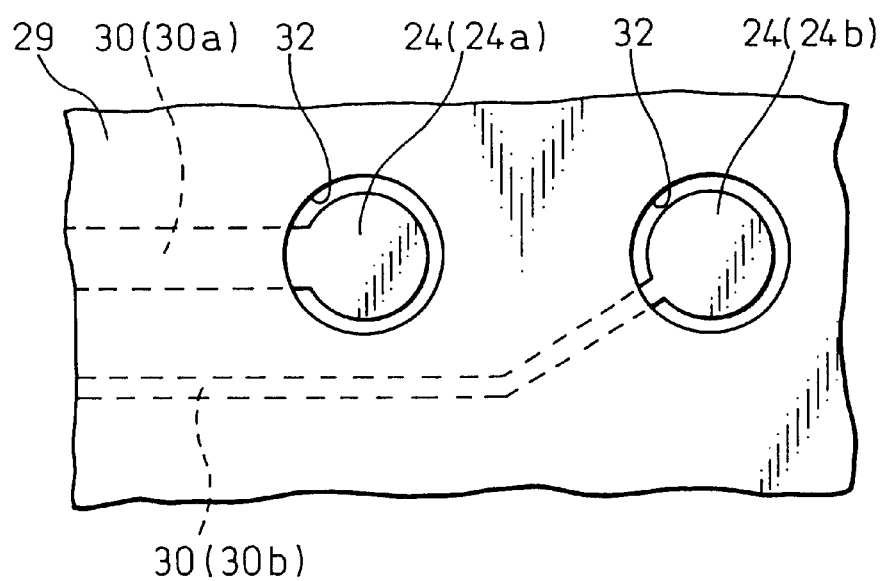
FIG. 7 is a plan view showing a part of the printed circuit board.

FIG. 6 is a cross-sectional view of the printed circuit board 12. FIG. 7 is a plan view showing a part of the printed circuit board 12. The printed circuit board 12 is a multi-layered printed circuit board and includes a plurality of insulator layers 26a to 26c, a plurality of conductor layers 28a to 28d and solder resists 29 covering the outermost conductor layers 28a and 28d, respectively. In FIG. 6, although three insulator layers 26a to 26c and four signal pattern layers 28a to 28d are shown for the purpose of simplification, the number of insulator layers and signal pattern layers may be modified. For instance, six to eight conductor layers are used in many cases.

The outermost conductor layer 28a (and the outermost conductor layer 28d) has the foot patterns 24 for mounting the BGA component 14 thereon and signal patterns 30 extending from the foot patterns 24. As shown in FIGS. 3 to 5 and 7, the foot pattern 24 is formed as a circular dot and the signal patterns 30 as a narrow line. The solder resist 29 covers the signal patterns 30 on the outermost conductor layer 28a (28d) and has openings 32 from which the foot patterns 24 are exposed. Therefore, the solder balls 22 on the substrate 16 can be connected to the foot patterns 24 through the openings 32. The solder resist 29 protects the signal patterns 30 and prevents adjacent solder balls from being brought into contact with each other at the time of reflow of the solder. Since the opening 32 is made slightly larger than the foot pattern 24, a part of the signal pattern is also exposed through the opening 32.

The first insulator layer 26a (26c) located directly underneath the outermost conductor layer 28a (28c) is formed, using a resin material and without using a glass cloth material, in order to reduce the weight of the printed circuit board 12. Furthermore, the second insulator layer 26b provided inwardly of the first insulator layer 26a (26c) is formed, using a glass cloth material. In addition, in FIG. 6, the second insulator layer 26 is shown as comprising only a single layer, but there are provided a plurality of second insulator layers in a multi-layered printed circuit board 12.

One of the two foot patterns 24 shown in FIG. 7 is the foot pattern 24a in the outer row shown in FIGS. 3 to 5, and the other is the foot pattern 24b inwardly of the outer row (or the foot pattern 24c further inwardly of the row of the foot pattern 24b). The width of the signal pattern 30a extending from the foot pattern 24a in the outer row is made greater than the width of the signal pattern 30b extending from the foot pattern 24b extending from the inner row (or the foot pattern 24c in the row further inwardly of the row of the foot pattern 24b). For instance, the width of the signal pattern 30a extending from the outer row is in the order of 0.4 mm, while the width of the signal pattern 30b extending from the foot pattern 24b in the inner row is in the order of 0.1 mm. The difference in width between the foot patterns 24 is in the order of 0.3 mm.

As is described above, when an external stress or a stress due to a thermal expansion is applied to the semiconductor apparatus 10, there is a problem in which the printed circuit board 12 and the BGA component 14 may be deformed. For instance, in FIG. 2, when a stress is applied to the printed circuit board 12, it warps as indicated by an arrow A, and when the BGA component 14 is thermally expanded, it warps as indicated by an arrow B. When the printed circuit board 12 and the BGA component 14 deform relative to each other such that one of the printed circuit board 12 and the BGA component 14 remains in a flat state while the other curves, stress is liable to concentrate on the solder balls 22a, in the outer row, and the foot pattern 24a, also in the outer row.

In the present invention, since the width of the signal pattern 30a extending from the foot pattern 24a in the outer row is widened and strengthened, the signal pattern 30a is constructed so as not to be broken even when a force is applied to this signal pattern 30a. In addition, since the signal pattern 30a is strengthened, the first insulator layer 26 positioned directly underneath the signal pattern 30a and formed without any glass cloth material is strengthened too, and therefore, cracks are hardly generated, the printed circuit board 12 does not fail, and the reliability of an information apparatus is ensured.

Figure 8:
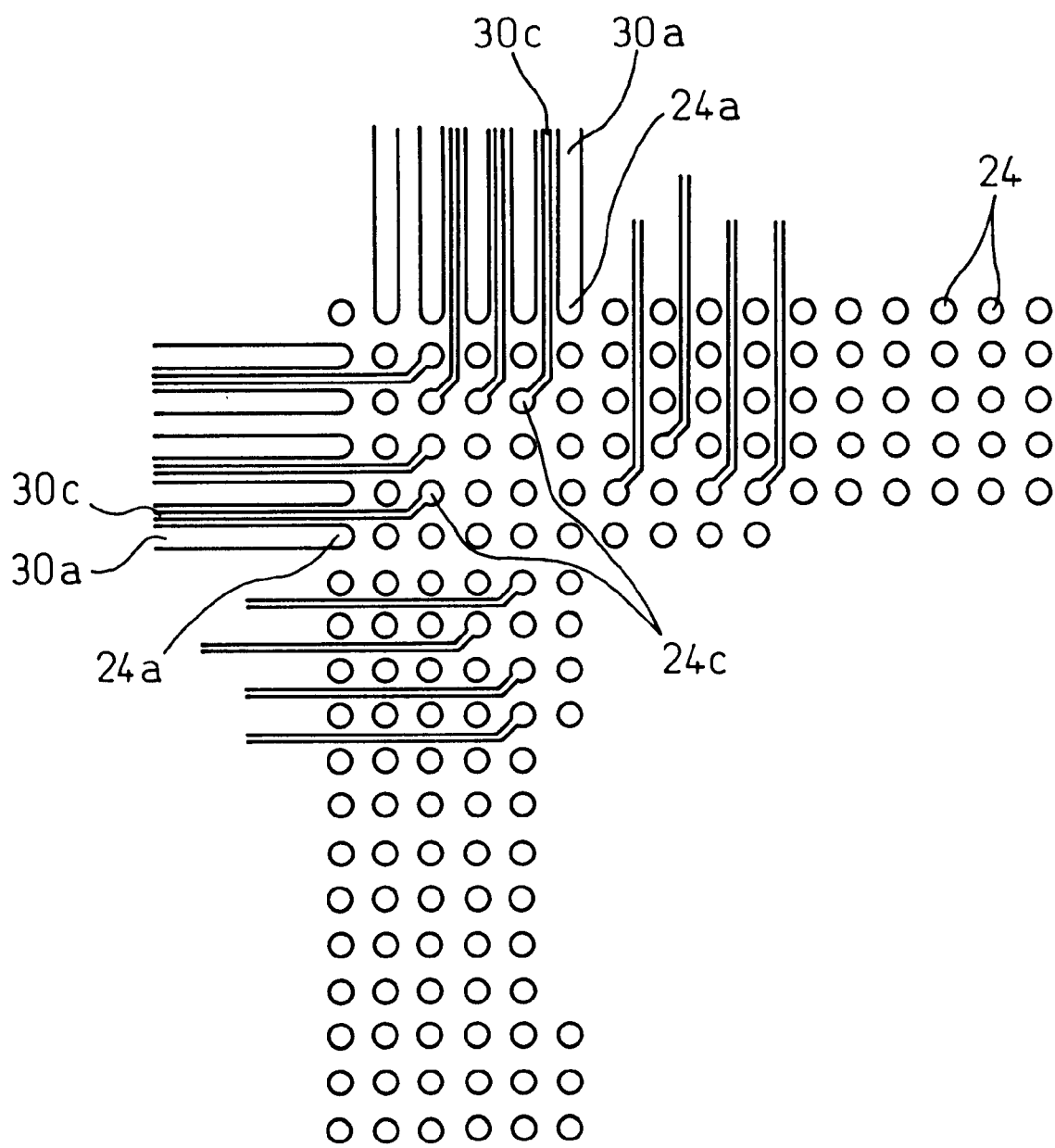
FIG. 8 is a view showing another example of the arrangement of foot pattern and signal patterns.

FIG. 8 shows another example of the arrangement of the foot patterns 24 and the signal patterns 30. In this example, the width of the signal pattern 30a extending from the foot pattern 24a in the outer row is greater than that of the signal pattern 30c extending from the foot pattern 24c in the row inwardly of the outer row. In this example, the foot pattern 24c in the inner row is positioned next to the foot pattern 24a in the outer row. The signal pattern 30a and the signal pattern 30c extend in parallel with each other, and since the pitch between the signal patterns 30a and 30c is limited, the widths of all the signal patterns cannot be increased. In other words, the width of only the signal pattern 30a that is most expected to break can be increased, so that all the signal patterns 30a and 30c can be disposed within a limited pitch. The operation of this example is similar to that of the previous example.

Figure 9:
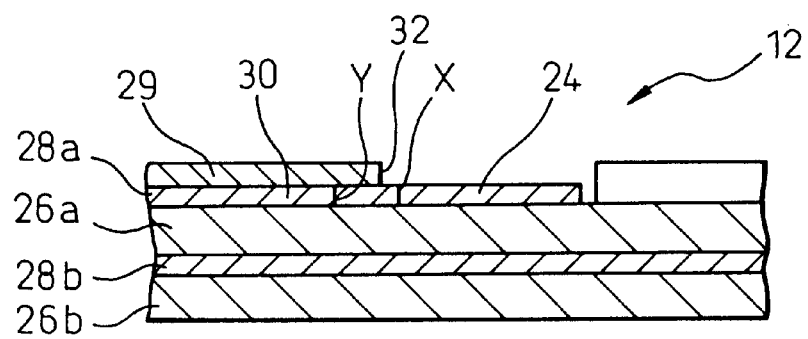
FIG. 9 is a cross-sectional view of the printed circuit board showing another example of the increased width of the signal pattern.
Figure 10:
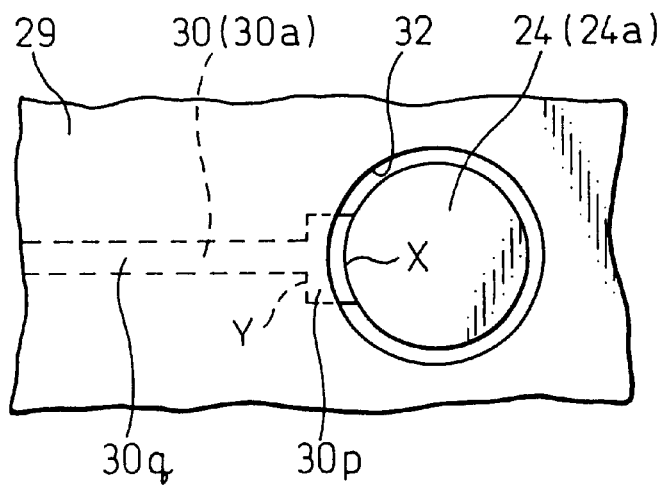
FIG. 10 is a plan view of the printed circuit board shown in FIG. 9.

FIG. 9 is a cross-sectional view of the printed circuit board 12 showing an example of the increased width of the signal pattern 30. FIG. 10 is a plan view of the printed circuit board 12 shown in FIG. 9. In the example shown in FIGS. 7 and 8, the width of the signal pattern 30a extending from the foot pattern 24a in the outer row is widened entirely, but as shown in FIGS. 9 and 10, the width of the signal pattern 30 extending from the foot pattern 24a in the outer row can be widened partially. In this case, it is desirable that a portion of the signal pattern 30a that is widened matches a portion thereof that is liable to fail.

In FIGS. 9 and 10, a point X denotes a connecting position between the foot pattern 24a and the signal pattern 30a, and a point Y a position on the signal pattern 30a which is covered with the solder resist 29 and is at a predetermined distance from the side wall of the opening 32. A portion of the signal pattern 30a from the point X to the point Y is referred to as a first portion 30p and a portion of the signal pattern 30a leftward from the point Y is as a second portion 30q. The second portion 30q extends as far as a final connecting point (a connecting point on the circuit board).

The width of the first portion 30p of the signal pattern 30a is made wider than that of the second portion 30q. The width of the second portion 30q can be made equal to those of the signal patterns (whose widths are not widened) 30b and 30c extending from the inner rows of foot patterns 24. With this construction, the portion of the signal pattern 30a which is liable to break can be strengthened.

In particular, a part of the first portion 30p of the signal pattern 30a which is liable to break is a portion which is close to the foot pattern 24a and is not covered with the solder resist 29 (a part from the side wall of the opening 32 to the point X), and therefore that portion only must be reinforced. Then, a part of the first portion 30p which is restrained by the solder resist 29 and is widened (a part from the side of the opening 32 to the point Y) restrains further a part of the first portion 30p which is not restrained by the solder resist 29 (a part from the side wall of the opening 32 to the point X). Therefore, the part of the first portion 30p which is restrained by the solder resist 29 and is widened (the part from the side wall of the opening to the point Y) may be short in length.

For instance, the diameter of the solder ball 22 is 0.5 to 0.6 mm, the diameter of the foot patter 24 is 0.7 mm, the diameter of the opening 32 is 0.8 mm, the width of the first portion 30p of the signal pattern 30a is 0.4 mm, and the width of the second pattern 30q of the signal pattern 30a is 0.1 mm. The distance between the point Y and the side wall of the opening 32 may be equal to or longer than the order of 0.3 mm.

Thus, a case has been heretofore described as a typical example of the present invention in which the BGA component is surface mounted to the printed circuit board including the insulator layers and the conductor layers.

In the present invention, an example has been described in which the foot patterns are arranged in a grid-like fashion, but the present invention is not limited to the grid-like arrangement. For instance, the foot patterns may be arranged in a zigzag or staggered fashion.

In addition, in the above embodiment, the printed circuit board has been described which includes the plurality of insulator layers and the plurality of conductor layers, but those insulator and conductor layers may comprise a singly layer, respectively.

The present invention may be applied to another type of LSI packaged electronic component. For instance, the present invention may also be applied to a case where when a PGA (Pin Grid Array in which pin-type terminals are arranged in a two-dimensional fashion on the back of a semi-conductor package) is mounted to a printed circuit board, a construction is adopted in which the pins are mounted to foot patterns of the printed circuit board, and the present invention does not exclude such a possible application. In addition, the present invention may be applied to a case where a certain component is mounted to an electronic component with not only what is commonly referred to as a PGA but also a plurality of terminals of a certain kind, and the present invention does not exclude such a possible application.

Described above is a case where the present invention is adopted to surface mount a component to a printed circuit board (attach a component to the surface of a substrate with solder), but the present invention does not exclude a case where a component is inserted into a printed circuit board for mounting. For instance, in a case where a number of pin-like terminals are attached to an electronic component, the pin-like terminals are inserted into holes formed in a printed circuit board and are soldered (on the back of the printed circuit board in a typical example). The present invention may be applied even to this case. For instance, there is a case where the aforesaid PGA package is insertion mounted to a printed circuit board. The present invention does not exclude a construction used in that case.

In addition, connecting portions for connection to the solder balls of the BGA component are illustrated as the foot patterns, but the present invention is not limited thereto, but a certain type of electrode and a connecting portion therewith, and a ring-like electrode or a ring-like electrode around a via hole may be used. In addition, the foot patterns are illustrated as being round, but the configuration of the foot patterns is not limited to a round shape, and any configuration may be used as long as an electric connection is established between the foot patterns and the solder balls and package terminals.

Furthermore, in the above embodiment, the component that is mounted to the printed circuit board is illustrated as the BGA (Ball Grid Array Package), but a CSP having a construction similar to that of the BGA may be used and is expected to provide effectiveness similar to that provided by the BGA. The present invention can be applied to semiconductors in general which have not only the BGA but also solder balls (or solders) providing a large thermal stress such as the CSP and in particular provide effectiveness when so used. In addition, the CSP (Chip Size Package, Chip Scale Package) is a package whose dimensions are close to the dimensions of an LSI chip, and in the case of ASIC having for instance 160 pins, the package area is reduced to one tenth the package area of a QFP (quad flat package) in general, whereby the package density can be improved. Some chips adopt as a form for the outer terminal the BGA (ball grid array), and others adopt a form of an LGA (land grid array). Moreover, the present invention may be applied to a SON (Small Outline Non-Leaded Package). In addition, a SON is a kind of CSP.

The embodiment discloses the following inventions.

The embodiment discloses as invention No. 1 "a printed circuit board comprising a plurality of insulator layers, a plurality of conductor layers, an outermost conductor layer of said plurality of conductor layers having a first group of foot patterns for attachment to a component and signal patterns extending from the foot patterns, said first group of foot patterns including foot patterns in an outer row and foot patterns in an inner row, the width of at least a part of the signal pattern extending from the foot pattern in the outer row being greater than the width of the signal pattern extending from the foot pattern in the inner row, and a protection layer covering said signal patterns in the outermost conductor layer, said protection layer having openings each for permitting the foot pattern to be exposed."

The embodiment of the present invention discloses as invention No. 2 "a printed circuit board as set forth in invention No. 1, wherein the plurality of insulator layers include a first insulator layer positioned directly underneath the outermost conductor layer and a second insulator layer positioned inwardly of the first insulator layer, the first insulator layer being formed without any glass cloth material, while the second insulator layer being formed using a glass cloth material."

The embodiment discloses as invention No. 3 "a printed circuit board as set forth in invention No. 1, wherein the width of the signal pattern extending from the foot pattern in the outer row remains constant along the length thereof."

The embodiment discloses as invention No. 4 "a printed circuit board as set forth in invention No. 1, wherein the signal pattern extending from the foot pattern in the outer row has a first portion a predetermined distance distant from a connecting position between the foot pattern and the signal pattern and a second portion connected to the first portion, the width of the first portion of the signal pattern being greater than the width of the second portion of the signal pattern."

The embodiment discloses as invention No. 5 "a printed circuit board as set forth in any of invention Nos. 1 to 4, wherein the component is a BGA component."

The embodiment discloses as invention No. 6 "a semiconductor apparatus comprising a printed circuit board including a plurality of insulator layers and a plurality of conductor layers, and components mounted to the printed circuit board, the outermost conductor layer of said conductor layers having a first group of foot patterns for attachment to a BGA component and signal patterns extending from the foot patterns, the first group of foot patterns including foot patterns in an outer row and foot patterns in an inner row, the width of at least a part of the signal pattern extending from the foot pattern in the outer row is greater than the width of the signal pattern extending from the foot pattern in the inner row, wherein the printed circuit board further comprises a protection layer covering the signal patterns on the outermost conductor layer, the protection layer having openings each for permitting the foot pattern to be exposed."

The embodiment discloses as invention No. 7 "a printed circuit board having a plurality of connecting portions for connection to terminals of a component and signal patterns extending from the connecting portion, the connecting portions including outer connecting portions and inner connecting portions, wherein the width of a part of the signal pattern extending from the outer connecting portion is greater than the width of the signal pattern extending from the inner connecting portion, and wherein the width of the signal pattern extending from the outer foot pattern remains constant in the length thereof."

The embodiment discloses as invention No. 8 "a printed circuit board having a plurality of connecting portions for connection to terminals of a component and signal patterns extending from the connecting portions, the connecting portions including outer connecting portions and inner connecting portions, wherein the signal pattern extending from the outer foot pattern has a first portion a predetermined distance distant from a connecting portion between the foot pattern and the signal pattern and a second portion connected to the first portion, and wherein the width of the first portion of the signal portion is greater than the width of the second portion of the signal pattern."

The embodiment discloses as invention No. 9 "a printed circuit board as set forth in inventions Nos. 7 and 8, wherein the printed circuit board includes a plurality of insulator layers and a plurality of conductor layers, an outermost conductor layer of the conductor layers includes foot patterns for mounting said component."

The embodiment discloses as invention No. 10 "a printed circuit board as set forth in invention No. 9, wherein the insulator layers include a first insulator layer positioned directly underneath the outermost conductor layer and a second insulator layer positioned inwardly of the first insulator layer, the first insulator layer being formed using a resin material, the second insulator layer being formed using a glass cloth material."

The inventions Nos. 1 to 10 are described in such a manner as described above in the above-described FIGS. 1 to 11.

Figure 11:
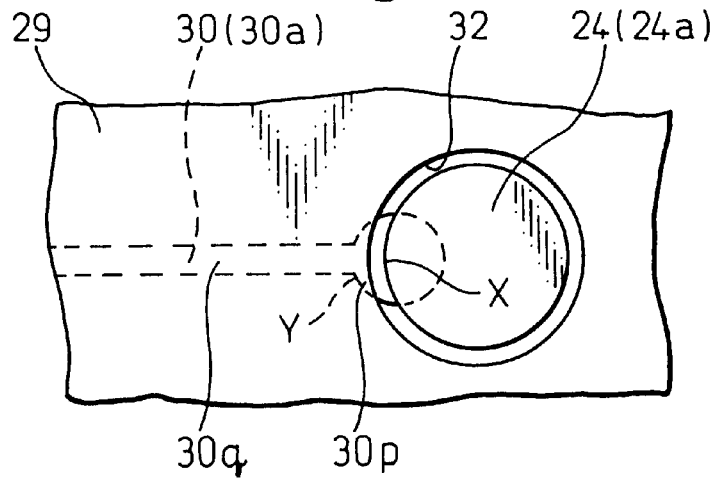
FIG. 11 is a plan view of the printed circuit board showing another example of the increased width of the signal pattern.

FIG. 11 is a cross-sectional view of the printed circuit board 12 showing another example of expansion of the width of the signal pattern 30. In this case too, the width of the signal pattern 30a extending from the foot pattern 24a in the outer row is partially widened. As with the case shown in FIG. 10, the signal pattern 30a has a first portion 30p and a second portion 30q, and the width of the first portion 30p is made wider than the width of the second portion 30q. In this example, the first portion 30p is formed as a part of a circle. Thus, there is imposed no limitation to the configuration of a part of the signal pattern 30a which is widened.

As has been described heretofore, according to the present invention, even when a stress is applied to the BGA component, the signal pattern can be constructed so as to be too hard to be broken by the stress. Furthermore, it is possible to obtain a printed circuit board and a semiconductor apparatus which can have reduced weights by adopting an insulator layer not using a glass cloth material.

In addition, in particular, with the BGA component being used in the printed circuit board, even when a stress is applied to the printed circuit board and the BGA component, the signal pattern extending from the foot pattern can be constructed so as to be too hard to break by such a stress, and by adopting an insulator layer not using a glass cloth material a printed circuit board and a semi-conductor apparatus can be obtained whose weights are reduced.

What is claimed is:

1. A printed circuit board comprising:
   a plurality of connecting portions for connection to terminals of a component; and
   signal patterns extending from said connecting portions, said connecting portions including outer connecting portions and inner connecting portions;
   wherein said printed circuit board has opposed outer edges, said outer connecting portions being located closer to each said opposed outer edge than said inner connecting portions; and
   wherein a width of at least a portion of said signal pattern extending from and located adjacent to said outer connecting portion is greater than a width of at least a portion of said signal pattern extending from and located adjacent to said inner connecting portion.

2. A printed circuit board comprising:
   a plurality of foot patterns for attachment of a component; and
   signal patterns extending from said foot patterns, said foot patterns including outer foot patterns and inner foot patterns;
   wherein said printed circuit board has opposed outer edges, said outer foot patterns being located closer to each said opposed outer edge than said inner foot patterns; and
   wherein a width of at least a portion of said signal pattern extending from and located adjacent to said outer foot pattern is greater than a width of at least a portion of said signal pattern extending from and located adjacent to said inner foot pattern.

3. A printed circuit board as set forth in claim 2, wherein the width of said signal pattern extending from said outer foot pattern is constant along a length thereof.

4. A printed circuit board as set forth in claim 2, wherein said signal pattern extending from said outer foot pattern has a first portion a predetermined distance distant from a connecting position between said foot pattern and said signal pattern and a second portion connected to said first portion, wherein the width of said first portion of said signal pattern is greater than the width of said second portion of said signal pattern.

5. A printed circuit board as set forth in claim 2, further comprising a plurality of insulator layers and a plurality of conductor layers, wherein an outermost layer of said plurality of conductor layers includes said foot patterns for attachment of said component.

6. A printed circuit board as set forth in claim 5, wherein said plurality of insulator layers include a first insulator layer positioned directly underneath said outermost layer and a second insulator layer positioned inwardly of said first insulator layer, said first insulator layer being formed of a resin material, said second insulator layer being formed of a glass cloth material.

7. A semi-conductor apparatus comprising a printed circuit board; and a component mounted to said printed circuit board;

wherein said printed circuit board comprises a plurality of foot patterns for attachment of a component and signal patterns extending from said foot patterns, wherein said printed circuit board has opposed outer edges, said outer foot patterns being located closer to each said opposed outer edge than said inner foot patterns; and wherein a width of at least a part of said signal pattern extending from and located adjacent to said outer foot pattern is greater than a width of at least a portion of said signal pattern extending from and located adjacent to said inner foot pattern.

8. A printed circuit board as set forth in claim 7, wherein said component is a BGA component.

* * * * *